United States Patent
Verschueren et al.

(12) 
(10) Patent No.: US 6,645,699 B2
(45) Date of Patent: Nov. 11, 2003

(54) METHOD OF PROCESSING A LITHOGRAPHIC PRINTING PLATE PRECURSOR

(75) Inventors: Eric Verschueren, Merksplas (BE); Joan Vermeersch, Deinze (BE)

(73) Assignee: Agfa-Gevaert (BE)

( * ) Notice: Subject to any disclaimer, the term of this patent is extended or adjusted under 35 U.S.C. 154(b) by 0 days.

(21) Appl. No.: 10/174,767

(22) Filed: Jun. 19, 2002

(65) Prior Publication Data

US 2003/0017418 A1 Jan. 23, 2003

Related U.S. Application Data

(60) Provisional application No. 60/307,496, filed on Jul. 24, 2001.

(30) Foreign Application Priority Data

Jun. 21, 2001 (EP) .............................................. 01000248

(51) Int. Cl.[7] ................................................. G03F 7/30
(52) U.S. Cl. ...................................... 430/302; 430/325
(58) Field of Search .................................. 430/302, 325

(56) References Cited

U.S. PATENT DOCUMENTS 5,253,006 A 10/1993 Takakura 5,871,584 A 2/1999 Tateyama et al.

FOREIGN PATENT DOCUMENTS

| JP | 58023440 | 2/1983 |
| WO | WO 99/35535 | 7/1999 |

*Primary Examiner*—Hoa Van Le
(74) *Attorney, Agent, or Firm*—Leydig, Voit & Mayer, Ltd.

(57) ABSTRACT

A method of making a lithographic image is disclosed, which comprises the steps of providing a lithographic imaging material comprising a support and a heat- or light-sensitive coating;

image-wise exposure of the coating to heat or light, thereby obtaining a latent image in said coating, the latent image consisting of a set of exposed areas in the coating and a set of non-exposed areas in the coating;

development of the latent image by supplying a processing liquid to the coating and evacuating, by means of a suction device, the processing liquid together with (i) substances removed from the exposed areas without removing such substances from the non-exposed areas or together with (ii) substances removed from the non-exposed areas without removing such substances from the exposed areas.

The method is especially suitable for processing a lithographic printing plate while it is mounted in a plate-setter or a printing press, without the risk of damaging or contaminating electro-optical components of such equipment.

9 Claims, 2 Drawing Sheets

METHOD OF PROCESSING A LITHOGRAPHIC PRINTING PLATE PRECURSOR

This application claims the benefit of U.S. Provisional Patent Application No. 60/307,496, filed Jul. 24, 2001, which is incorporated by reference.

FIELD OF THE INVENTION

The present invention relates to a method for processing a lithographic imaging material with a liquid. More preferably, the invention relates to a method of wet processing a lithographic printing plate material that can be performed while the material is contained in a printing press.

BACKGROUND OF THE INVENTION

Lithographic printing presses use a so-called printing master such as a printing plate that is mounted on a cylinder of the printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

In recent years the so-called 'computer-to-plate' (CTP) method has gained a lot of interest. This method, also called 'direct-to-plate', bypasses the creation of film because the digital document is transferred directly to a plate precursor by means of a so-called plate-setter. A special type of CTP involves the exposure of a plate precursor while being mounted on a plate cylinder of a printing press by means of a plate-setter that is integrated in the press. This method may be called 'computer-to-press' and printing presses with an integrated plate-setter are sometimes called digital presses. A review of digital presses is given in the Proceedings of the Imaging Science & Technology's 1997 International Conference on Digital Printing Technologies (Non-Impact Printing 13). Computer-to-press methods have been described in e.g. EP-A 770 495, EP-A 770 496, WO 94001280, EP-A 580 394 and EP-A 774 364.

Especially thermal plates, which are sensitive to heat or infrared light, are widely used in computer-to-plate and computer-to-press methods because of their daylight stability. Such thermal materials preferably comprise a compound that converts absorbed light into heat. The heat, which is generated on image-wise exposure, triggers a (physico-) chemical process, such as ablation, polymerization, insolubilization by cross-linking of a polymer, decomposition, or particle coagulation of a thermoplastic polymer latex, and after optional processing, a lithographic image is obtained.

Thermal plate materials, which are often used in computer-to-press methods, are based on heat-induced ablation. A problem associated with ablative plates is the generation of debris that is difficult to remove and may disturb the printing process or may contaminate the exposure optics of the integrated image-setter. As a result, such ablative plates require a processing step for removing the debris from the exposed material.

A non-ablative plate which can be developed with fountain and ink is described in EP-B 770 494. The latter patent specification discloses a method wherein an imaging material comprising an image-recording layer of a hydrophilic binder, a compound capable of converting light to heat and hydrophobic thermoplastic polymer particles, is image-wise exposed, thereby converting the exposed areas into an hydrophobic phase which define the printing areas of the printing master. The press run can be started immediately after exposure without any additional treatment because the layer is developed by interaction with the fountain and ink that are supplied to the cylinder during the press run. So the wet chemical processing of these materials is 'hidden' to the user and accomplished during the first runs of the printing press. A problem associated with such non-ablative, hidden-processing materials is the low run length of the plate.

Other thermal plates, e.g. Agfa's Thermostar™ or Electra™ from Kodak Polychrome Graphics, provide a longer run length but require wet processing with alkaline liquids which may damage or contaminate the electronics and optics of the integrated image-setter and other devices of a digital printing press. Also UV-sensitive plates would be very suitable for CTP because of their potential stability in visible or yellow light. In addition, most conventional UV-sensitive, so-called pre-sensitized ("PS") plates, which are normally used for contact exposure through a film mask, enable a very high run length in addition to other benefits such as high speed, resistance to press chemicals, and better physical resistance, e.g. towards scratching, than typical thermal plates. However, such PS plates also require alkaline processing, which makes them less suitable for on-press processing as required in computer-to-press methods. Such plates are therefore usually developed in a dedicated processing apparatus and then mounted on the press. This requires quite some plate handling during mounting and registering of the plates and therefore involves a risk of scratches, fingerprints or other damage or contamination of the lithographic image.

So there is a need for a wet processing method which can be performed while the imaging material is mounted near to optical, electronic or other fragile components, such as in a plate-setter or digital printing press, without the risk of damaging or contaminating such devices. Such a processing method opens computer-to-press systems to plates that require wet processing but on the other hand are characterized by benefits such as long run length or daylight stability.

SUMMARY OF THE INVENTION

It is an object of the present invention to provide a method of wet processing which can be carried out on a lithographic imaging material, wherein the risk of damaging or contaminating nearby electronic and optical components is minimized. This object preferably is achieved by the characterizing features of the present invention. Advantageous embodiments and further developments of the solution will be apparent from the description of the invention provided herein. According to the method of the present invention, a processing liquid is supplied to a lithographic imaging material which comprises a support and a heat- or light-sensitive coating, which may consist of one or more layer(s) provided on the support. The material forms a latent image upon image-wise exposure, preferably without substantially ablating the coating, i.e. without removing an amount of substances from the coating during the exposure that would be sufficient to create a useful image before the wet development step. The latent image consists of areas in the coating from which substances can be removed by the processing liquid and other areas from which these substances are not removed in the development step. The processing liquid is evacuated by means of a suction device together with one or more substance(s) that have been removed from the coating. Substances are removed from the coating by the processing liquid either at the exposed or at the non-exposed areas. The term "removed" or "removable" indicates that substances are or can be removed from the coating by the supply of the processing liquid by dissolution of said substances in the liquid or by the formation of a suspension, dispersion or emulsion of said substances in the liquid.

The benefits of the methods of the present invention are mainly achieved by the use of a suction device that collects the processing liquid from the material together with substances from the developed coating. The suction device can simply be a porous material such as a sponge or a liquid-absorbing cloth. Such porous material can be supplied from a roll and, after contacting the imaging material, be wound up on another roll. The supply of processing liquid and the collection thereof by suction can also be carried out with an apparatus as shown in the figures, which are discussed in more detail below. Such an apparatus is preferred over the use of a porous material since it reduces the risk of linting of clothes and the risk of mechanical damage or contamination of the lithographic support.

More specifically, the present invention provides a method of wet processing which can be carried out on a lithographic printing plate precursor that is mounted in a plate-setter or a digital printing press, e.g. while the plate precursor is mounted on the plate cylinder of a printing press. Besides the reduced risk of damaging nearby electro-optical components, such an on-press processing method provides the additional benefits that the plate does not need to be handled after exposure and processing and that it is not necessary to apply a so-called desensitizing coating (gum layer) to protect the developed plate against fingerprints or other contamination. Since the processing liquid and any substances from the coating contained therein are removed by the suction device, there is no risk of contaminating the ink or the fountain that is used in the subsequent printing step.

A preferred lithographic imaging material is a lithographic printing plate precursor which can form a lithographic image consisting of two sets of areas which have opposite affinity towards ink or an ink-abhesive fluid (i.e. hydrophilic and hydrophobic areas for wet offset printing or oleophilic and oleophobic areas for driographic printing). Such a lithographic image can be obtained after a wet development step wherein a layer having a first affinity towards ink or an ink-abhesive fluid is removed from the material and thereby another layer, or the support, is revealed which has the opposite affinity towards ink or an ink-abhesive fluid. The methods of the present invention are suitable for removing ablation debris from the exposed printing plate precursor, wherein it may suffice to use water as a processing liquid. In a more preferred embodiment, the printing plate precursor is non-ablative, i.e. the material shows no substantial ablation of one or more layer(s) upon exposure. "No substantial ablation" means that no useful lithographic image is formed after exposure by ablative removal of a layer. Instead, the preferred plate precursors used in the present invention form a useful lithographic image only after removal of exposed or non-exposed areas of the coating by means of a wet development step.

The step of image-wise exposure can involve exposure to electromagnetic radiation or to heat, since the method of the present invention is applicable to both light- and heat-sensitive materials. Preferred light-sensitive materials are UV-sensitive, especially UV-sensitive materials which can be handled in daylight. For similar reasons, heat-sensitive materials that can be exposed with a thermal head or infrared radiation are also very suitable. For the image-wise exposure, laser-scanning devices are preferred, especially UV and infrared light emitting lasers. Also UV lamps, preferably digitally modulated, e.g. by means of light valves or a digital mirror device, can be used.

The processing liquid can be applied to the exposed imaging material by dipping or immersion, but coating methods are especially preferred over dip tanks because of the lower consumption of processing liquid and the smaller probability of degradation of the liquid, e.g. by oxidation, uptake of carbon dioxide, etc. More specifically, the processing liquid can be jetted or sprayed, e.g. by means of an apparatus as shown in the figures, or applied by roller coating. A preferred processing liquid is an aqueous alkaline solution, having a pH in the range 7.5–14. The processing can be achieved by chemical as well as mechanical effects. Both effects are preferably combined, e.g. the mechanical impact of jetted processing liquid may facilitate the removal of the layers from the material. Other suitable mechanical treatments may involve rubbing, brushing, or ultrasonic treatment. Mechanical treatment is advantageous since it provides the possibility to reduce the chemical reactivity of the processing liquid, e.g. to reduce the pH or the temperature thereof.

According to still another method of the present invention, a film of a processing liquid is applied on the coating as described above, but without using the suction device and then, after a time period of preferably at least 10 seconds, more preferably between 20 and 90 seconds, during which the processing liquid attacks the coating, the processing liquid is removed by the suction device together with removable substances from the coating.

The development step may be followed by an optional rinse step, e.g. with water applied by a pressure-washer, and an optional drying step, e.g. by applying hot air or by using infrared lamps. The development step may also be preceded by a pre-treatment such as soaking the layer(s) of the imaging material with water or another liquid.

PREFERRED EMBODIMENTS OF THE INVENTION

The Imaging Material

Figure 1:
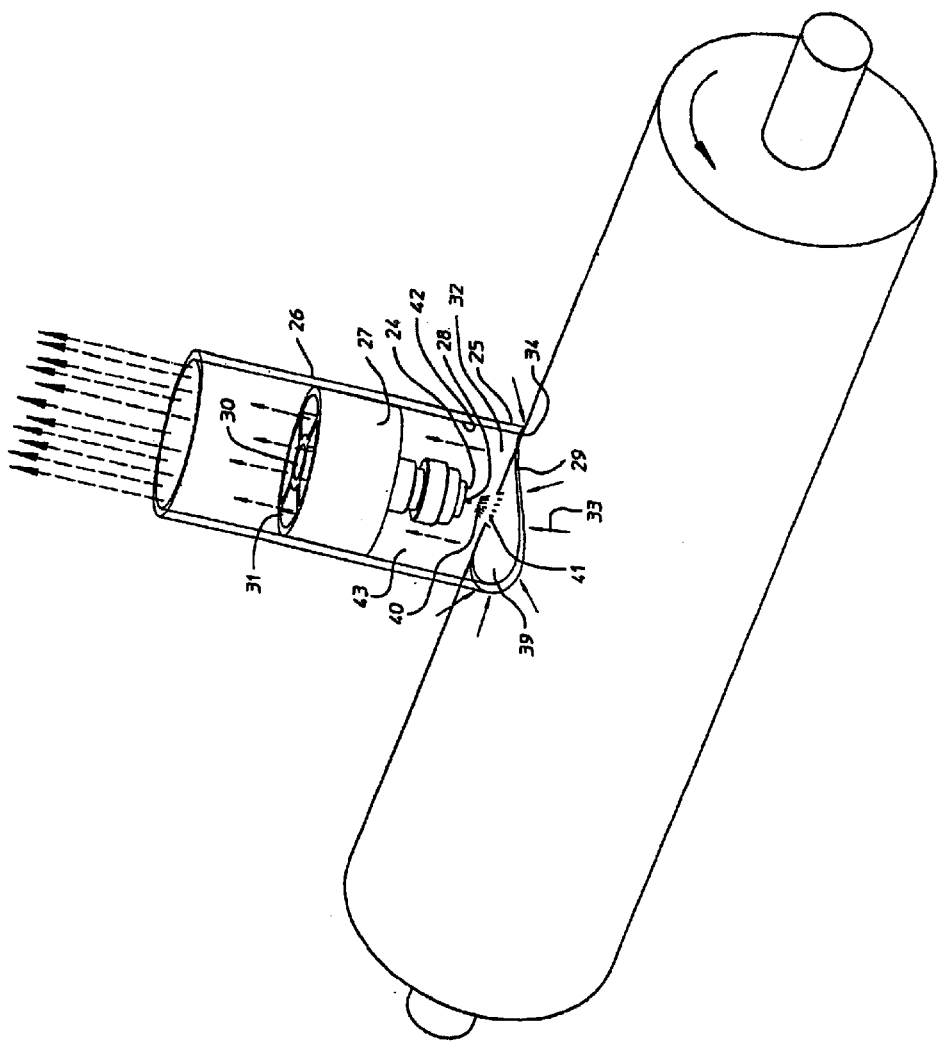
FIG. 1 is a perspective view of an apparatus that is suitable for executing the development step in the method of the present invention.

The lithographic imaging material comprises at least one image-recording layer provided on a support. Preferably, only a single imaging layer is provided on the support. The lithographic printing plate precursor for use in the methods of the present invention can be negative or positive working, i.e. can form ink-accepting areas at exposed or at non-exposed areas respectively. In a preferred positive working embodiment, the material contains a layer which is ink-accepting and not removable by the processing liquid before exposure and which is rendered removable upon exposure, so that an underlying hydrophilic layer or support is revealed at exposed areas after processing. In a preferred negative working embodiment, the material contains a layer which is removable by the development step at non-exposed areas and which is converted to a non-removable state by the exposure, so that an underlying hydrophilic layer or a hydrophilic support is revealed by the development step at non-exposed areas and an ink-accepting layer remains after the processing at exposed areas.

Highly preferred but non-limiting embodiments of such materials contain a hydrophilic support and a coating provided thereon which is hydrophobic or is converted to a hydrophobic state upon exposure. Such materials can be provided by coating, spraying, or jetting an image-recording layer on a support while it is mounted in a printing press or plate-setter. Or the end-user may mount a ready-made imaging material, supplied by a plate manufacturer, on the press or a plate-setter and then expose and develop it according to the methods of the present invention.

More specific embodiments of suitable lithographic imaging materials will now be discussed.

The Support

The support of the printing plate precursor may be a sheet-like material such as a plate or it may be a cylindrical element such as a sleeve that can be slid around a print cylinder of a printing press. Alternatively, the support can also be the print cylinder itself. In the latter option, the image-recording layer is provided on the print cylinder, e.g. by on-press spraying as indicated above. The support is preferably a hydrophilic support or a support that is provided with a hydrophilic layer. Preferably, the support is a metal support such as aluminum or stainless steel.

A particularly preferred hydrophilic support is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate of thin aluminum and plastic. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 $\mu$m and is preferably 1 to 10 $\mu$m.

The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumna particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

It is particularly preferred to use a film support to which an adhesion-improving layer, also called subbing layer, has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion-improving layer is between 200 mg/m$^2$ and 750 mg/m$^2$. Further, the ratio of silica to hydrophilic binder is preferably more than 1 and the surface area of the colloidal silica is preferably at least 300 m$^2$/gram, more preferably at least 500 m$^2$/gram.

Heat-Sensitive Imaging Materials

The imaging mechanism of thermal materials can be triggered by direct exposure to heat, e.g. by means of a thermal head, or by the light absorption of one or more compounds in the coating that are capable of converting light, more preferably infrared light, into heat. Particularly useful light-to-heat converting compounds are for example dyes, pigments, carbon black, metal carbides, borides, nitrides, carbonitrides, bronze-structured oxides, and conductive polymer dispersions such as polypyrrole, polyaniline or polythiophene-based conductive polymer dispersions. Infrared dyes and carbon black are highly preferred.

In a first suitable example of a thermal printing plate precursor, the working mechanism of the coating relies on the heat-induced coalescence of hydrophobic thermoplastic polymer particles, preferably dispersed in a hydrophilic binder, as described in e.g. EP 770 494; EP 770 495; EP 770 497; EP 773 112; EP 774 364; and EP 849 090. Such a material is commercially available from Agfa-Gevaert under the trade name Thermolite.

The coalesced polymer particles define a hydrophobic, printing area that is not readily removable during the development step whereas the unexposed layer defines a non-printing area that is readily removable during the development step. The hydrophobic thermoplastic polymer particles preferably have a coagulation temperature above 35° C. and more preferably above 50° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. Specific examples of hydrophobic polymer particles are e.g. polyethylene, polyvinyl chloride, polymethyl (meth)acrylate, polyethyl (meth) acrylate, polyvinylidene chloride, polyacrylonitrile, polyvinyl carbazole, polystyrene or copolymers thereof. Most preferably used is polystyrene. The weight average molecular weight of the polymers may range from 5,000 to 1,000,000 g/mol. The hydrophobic particles may have a particle size from 0.01 µm to 50 µm, more preferably between 0.05 µm and 10 µm and most preferably between 0.05 µm and 2 µm. The amount of hydrophobic thermoplastic polymer particles contained in the image forming layer is preferably between 20% by weight and 65% by weight and more preferably between 25% by weight and 55% by weight and most preferably between 30% by weight and 45% by weight.

Suitable hydrophilic binders are for example synthetic homo- or copolymers such as a polyvinylalcohol, a poly (meth)acrylic acid, a poly(meth)acrylamide, a polyhydroxyethyl(meth)acrylate, a polyvinylmethylether or natural binders such as gelatin, a polysacharide such as e.g. dextran, pullulan, cellulose, arabic gum, alginic acid.

In a second suitable embodiment, the coating comprises an aryldiazosulfonate homo- or copolymer that is hydrophilic and soluble in the processing liquid before exposure and rendered hydrophobic and less soluble after such exposure. The exposure can be done by the same means as discussed above. Alternatively, the aryldiazosulfonate polymer can also be switched by exposure to UV light, e.g. by a UV laser or a UV lamp.

Preferred examples of such aryldiazosulfonate polymers are the compounds which can be prepared by homo- or copolymerization of aryldiazosulfonate monomers with other aryldiazosulfonate monomers and/or with vinyl monomers such as (meth)acrylic acid or esters thereof, (meth) acrylamide, acrylonitrile, vinylacetate, vinylchloride, vinylidene chloride, styrene, α-methyl styrene etc. Suitable aryldiazosulfonate polymers for use in the present invention have the following formula:

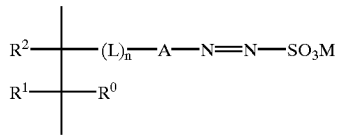

wherein $R^{0,1,2}$ each independently represent hydrogen, an alkyl group, a nitrile or a halogen, e.g. Cl, L represents a divalent linking group, n represents 0 or 1, A represents an aryl group and M represents a cation. L preferably represents divalent linking group selected from the group consisting of —$X_t$—$CONR^3$—, —$X_t$—COO—, —X— and —$X_t$—CO—, wherein t represents 0 or 1, $R^3$ represents hydrogen, an alkyl group or an aryl group, X represents an alkylene group, an arylene group, an alkylenoxy group, an arylenoxy group, an alkylenethio group, an arylenethio group, an alkylenamino group, an arylenamino group, oxygen, sulfur or an aminogroup. A preferably represents an unsubstituted aryl group, e.g. an unsubstituted phenyl group or an aryl group, e.g. phenyl, substituted with one or more alkyl group, aryl group, alkoxy group, aryloxy group or amino group. M preferably represents a cation such as $NH_4^+$ or a metal ion such as a cation of Al, Cu, Zn, an alkaline earth metal or alkali metal.

Suitable aryldiazosulfonate monomers for preparing the above polymers are disclosed in EP-A 339393, EP-A 507008 and EP-A 771645.

A third suitable embodiment of a thermal printing plate is positive working and relies on photo-induced solubilization of a novolac layer. Known examples are Agfa's Thermostar™ and Electra™ from Kodak Polychrome Graphics, of which the composition and working mechanism has been described in e.g. EP-A 864 420, EP-A 908 305, EP-A 908 779, EP-A 908 784, EP-A 908 306, EP-A 908 307, EP-A 950 517, EP-A 950 518, EP-A 825 927, EP-A 823327 and WO99/21725.

Light-Sensitive Imaging Materials

In addition to the above thermal materials, also light-sensitive coatings can be used in the methods of the present invention. Typical examples of plates which are sensitive to visible light work according to the silver salt diffusion transfer reversal mechanism, such as the Lithostar™ plate materials of Agfa-Gevaert, or are based on photopolymerization, e.g. the N90™ and N91™ plate materials, both also available from Agfa-Gevaert, can be used.

In a particular embodiment of the present invention, a conventional, UV-sensitive "PS" plate is used. Suitable examples of such plates, that are sensitive in the range of 300–450 nm (near UV and blue light), have been discussed in EP 1 029 668 A2. More details of positive and negative working compositions that are typically used in "PS" plates will now be discussed in more detail.

The positive working imaging layer preferably comprises an o-naphtoquinonediazide compound (NQD) and an alkali soluble resin. Particularly preferred are o-naphthoquinonediazidosulfonic acid esters or o-naphthoquinone diazidocarboxylic acid esters of various hydroxyl compounds and o-naphthoquinone-diazidosulfonic acid amides or o-naphthoquinone-diazidocarboxylic acid amides of various aromatic amine compounds.

Two variants of NQD systems can be used: one-component systems and two-component systems. In the former case, the sulfonic or carboxyl acid group is linked directly to the phenolic hydroxy group of a water insoluble, alkali soluble or swellable resins having a is phenolic hydroxy group. It is preferred that some phenolic hydroxy groups remain unsubstituted. Examples of such compounds include phenol, cresol, resorcinol and pyrogallol. Examples of preferred water insoluble, alkali soluble or swellable resins having a phenolic hydroxy group include phenol-formaldehyde resin, cresol-formaldehyde resin, pyrogallol-acetone resin and resorcinol-benzaldehyde resin. Typical examples include esters napthoquinone-(1,2)-diazidosulfonic acid and phenol-formaldehyde resin or cresol-formaldehyde resin, esters of naphthoquinone-(1,2)-diazido-(2)-5-sulfonic acid and pyrogallol-acetone resin as disclosed in U.S. Pat. No. 3,635,709 and esters of naphthoquinone-(1,2)-diazido-(2)-5-sulfonic acid and resorcinol-pyrogallol-acetone copolycondensates as disclosed in J. P. KOKAI No. Sho 55-76346.

Examples of other useful compounds are polyesters having hydroxyl groups at their termini esterified with o-napthoquinone-diazidesulfonyl chloride as disclosed in J. P. KOKAI No. Sho 50-117503; homopolymers of p-hydroxystyrene or copolymers thereof with other copolymerizable monomers esterified with o-naphtoquinone-diazidosulfonyl chloride as disclosed in J. P. KOKAI No. Sho 50-113305; condensates of alkyl acrylate-acryloyloxyalkyl carbonate-hydroxyalkyl acrylate copolymers with o-naphthoquinonediazido-sulfonyl chloride as disclosed in U.S. Pat. No. 3,859,099; amides of copolymers of p-aminostyrene and monomers copolymerizable therewith and o-naphthoquinonediazido-sulfonic acid or o-naphthoquinonediazidocarboxylic acid as disclosed in U.S. Pat. No. 3,759,711; as well as ester compounds of polyhydroxybenzophenone and o-naphthoquinonediazidosulfonyl chloride.

These compounds may be used alone but are preferably used as a mixture with an alkali-soluble resin to form a light-sensitive layer.

In the application of NQD as two-component systems various low-molecular NQD sulfonic or carboxyl acid derivatives are dissolved mainly in certain water insoluble, alkali soluble or swellable resins; the latter acts as polymeric binder for NQD. Preferably said 4- or 5-sulfonyl or carboxyl substituted 1,2 naphthoquinone-diazides are esters of 1,2 naphthoquinonediazides-4- or -5-sulfonic or carboxylic acids with a phenolic compound having at least two phenolic hydroxy groups, more preferably with a phenolic compound having at least three phenolic hydroxy groups. Further suitable 1,2 naphthoquinone-2-diazides are disclosed in GB-A 739654 and in U.S. Pat. No. 4,266,001.

Preferred water insoluble, alkali soluble or swellable resins are resins, which comprise phenolic hydroxy groups, oxime groups or sulfonamido groups. More preferred are resins having phenolic hydroxy groups, and phenolic hydroxy functionalized derivatives of poly(meth)acrylates, which can be synthesized starting from e.g. hydroxyethyl (meth)acrylate.

Most preferred are synthetic novolac resins and typical examples thereof are phenolformaldehyde resin, cresol-formaldehyde resin, and phenol-cresol-formaldehyde copolycondensed resins as disclosed in J. P. KOKAI No. Sho 55-57841

The negative working layer of a "PS" plate preferably comprises a diazonium salt, a diazonium resin or an aryl-diazosulfonate homo- or copolymer. Examples of low-molecular weight diazonium salts for use in the present invention include: benzidine tetrazoniumchloride, 3,3'-dimethylbenzidine tetrazoniumchloride, 3,3'-dimethoxybenzidine tetrazoniumchloride, 4,4'-diaminodiphenylamine tetrazoniumchloride, 3,3'-diethylbenzidine tetrazoniumsulfate, 4-aminodiphenylamine diazoniumsulfate, 4-aminodiphenylamine diazoniumchloride, 4-piperidino aniline diazoniumsulfate, 4-diethylamino aniline diazoniumsulfate and oligomeric condensation products of diazo-diphenylamine and formaldehyde. Examples of diazo resins useful in the present invention include condensation products of an aromatic diazonium salt as the light-sensitive substance. Such condensation products are described, for example, in DE-P-1 214 086. The light- or heat-sensitive layer preferably also contains a binder e.g. polyvinyl alcohol.

Upon exposure the diazo resins or diazonium salts are converted from water soluble to water insoluble (due to the destruction of the diazonium groups) and additionally the photolysis products of the diazo may increase the level of crosslinking of the polymeric binder or diazo resin, thereby selectively converting the coating, in an image pattern, from water soluble to water insoluble. The unexposed areas remain unchanged, i.e. water-soluble.

The Development Step

According to a particular embodiment of the present invention, the processing of the image-wise exposed material is carried out by jetting or spraying a processing liquid with an apparatus as described below and evacuating the processing liquid together with substances from the coating of the imaging material by vacuum suction, which is also applied by means of the same apparatus. The impact of sprayed or jetted droplets of the processing liquid may produce a mechanical effect on the coating, which may be enhanced by the addition of solid particles in the processing liquid, by ultrasonic treatment, etc. Simultaneous chemical and mechanical treatment of the coating can also be achieved by the apparatus of FIGS. 2 and 3, discussed in detail below.

Figure 2:
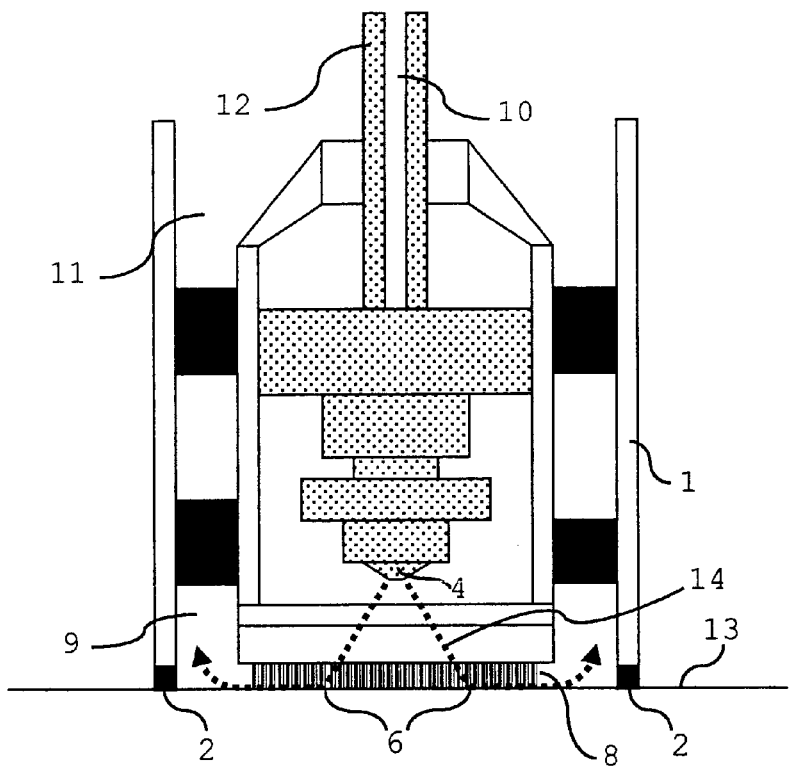
FIG. 2 is a lateral view of another apparatus that is suitable for executing the development step in the method of the present invention.
Figure 3:
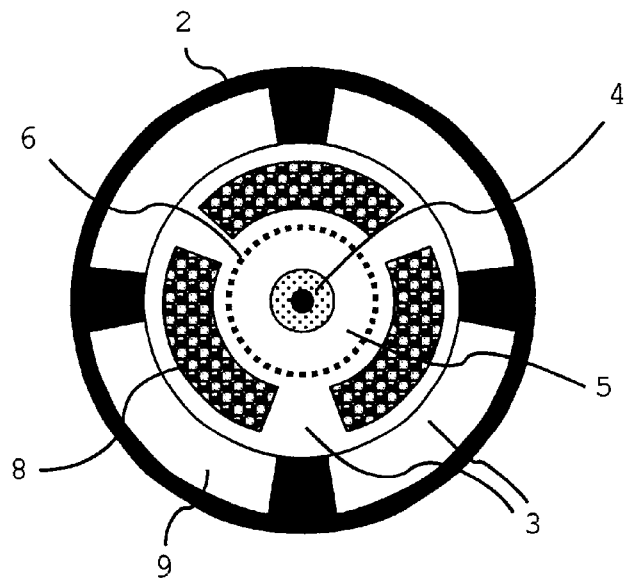
FIG. 3 is an end view of the apparatus shown in FIG. 2.

In another embodiment according to the present invention, a film of a first processing liquid is applied on the coating of the imaging material, e.g. by using the apparatus of FIG. 1, 2 or 3 as a coating apparatus, i.e. without engaging the vacuum suction. After a suitable period of time, during which the processing liquid attacks the coating, the apparatus is used for spraying or jetting a second processing liquid onto the imaging material and image-wise removing substances from the coating of the imaging material by engaging the vacuum suction. The second processing liquid can be the same as the first processing liquid. Preferably, the second processing liquid does not chemically attack the coating but is only used as a carrier for withdrawing the substances from the coating, e.g. plain water.

According to still another method of the present invention, a film of a processing liquid is applied on the coating as described above and, after a while, said film is removed together with substances from the coating by engaging only the vacuum suction of the apparatus, i.e. without supplying a second processing liquid.

After processing, the developed image may be rinsed with a liquid, e.g. water, which may comprise additives, e.g. compounds for adjusting the surface tension of the liquid. The rinsing liquid may be applied by the same means as the processing liquid and may also be collected by suction as the processing liquid. The collected processing liquid and/or the rinsing liquid may be recycled and reused for the processing and rinsing of a next imaging material.

Processing Apparatus

The apparatus of FIG. 1 is a suitable example of a processing apparatus that is capable of simultaneously supplying a processing liquid to the imaging material and collecting the liquid together with substances removed from the coating via a suction nozzle wherein a sub-pressure is maintained. The apparatus of FIG. 1 has been described in U.S. Pat. No. 5,603,775, albeit for another purpose as the method of the present invention. The apparatus is especially designed for treating materials that are mounted on a drum or a cylinder and is therefore particularly suitable for on-press processing. It can be translated scanwise in the axial direction of a rotating drum that carries the imaging material on its outer surface. In a very compact configuration, an apparatus as shown in FIGS. 1, 2 and 3 can be mounted on the same carriage as a laser device used for image-wise exposing the imaging material. In such an embodiment, the material is developed very shortly after being exposed, which is advantageous for imaging layers that form a weak (unstable) latent image.

The apparatus of FIG. 1 includes a housing 25 consisting of a casing with circular cross section, and a spray or jet nozzle 24 arranged in the casing 25 in the immediate vicinity of the centerline of the casing. The terms "jet" and "spray" refer to a stream of a liquid phase, which is projected from nozzle 24 onto the coating of the imaging material. A "spray" is typically an aerosol of droplets of the processing liquid in pressurized air or another propellant. The term "spray" is also used herein for a method wherein a processing liquid is applied without a propellant, but typically at a low liquid supply pressure, e.g. just above normal atmospheric pressure. Preferred values of spray parameters have been defined in EP-A 1 084 830. A "jet" is normally obtained without a propellant, preferably at a high liquid supply pressure of between e.g. 50 and 150 bar and a supply rate of e.g. 20 to 60 ml/sec, more preferably 30 to 40 ml/sec.

The casing 25, which is preferably cylindrical, itself forms an elongate suction nozzle 26 which terminates in an orifice edge 29 surrounding an opening 39 free from mechanical parts. The suction nozzle 26 contains a chamber 32 comprising said opening 39 and is arranged spaced from the material to be developed to form a circumferential gap 34 between the material and orifice edge 29. The nozzle 24 is arranged in the chamber 32 of the casing, spaced axially from the opening 39, to emit a jet or spray 40 of processing liquid producing a treatment area 41 on the material. A holder 27 carries the nozzle 24, the orifice 28 of which is located centrally in the casing 25. The front end of the suction nozzle 26 is shaped with a contour to fit the curvature of the material to produce said gap 34. The holder 27 comprises a supply channel 30 communicating with the nozzle 24. The holder 27 is also provided with a plurality of peripheral, axial through-holes 31 through which an evacuation pipe communicates openly with the chamber 32 of the suction nozzle 26.

An even more preferred apparatus, which comprises rubbing means 8 and thereby enables both chemical and mechanical processing, is depicted in FIGS. 2 and 3. It has been described in EP-A no. 01000004.0, filed on Feb. 6, 2001, for the purpose of removing ink-accepting areas from a printing master after printing, i.e. removing the lithographic image from the plate, contrary to the purpose of a particular method of the present invention wherein the apparatus is used for developing an image-wise exposed printing plate precursor so as to obtain a master carrying a lithographic image which can then be used for printing.

The apparatus of FIGS. 2 and 3 comprises an elongated housing 1, which is preferably cylindrical, having at an end thereof an edge 2 which surrounds an opening 3. The edge 2 preferably has a circular cross section and may be flat or concave, so as to comply with flat or curved surfaces to be cleaned. In a preferred embodiment, the edge 2 is inwardly curved and its curvature is the same as the curvature of the roll surface that is to be cleaned. The housing 1, edge 2 and opening 3 form a suction nozzle for removing the processing liquid and any substances from the coating of the imaging material.

The apparatus comprises one or more jet or spray nozzles 4, spaced from opening 3 by a certain distance, so that a processing liquid can be projected onto a treatment zone of surface 13. The processing liquid is supplied to nozzle 4 via a supply channel 10, which is coupled to the known devices for feeding a liquid to a nozzle, such as a pump, hoses, filters, etc. In another embodiment, the apparatus also comprises a propellant supply channel (not shown in the figures) which forms a spray together with the processing liquid supplied via channel 10. The spray can be formed in nozzle 4 by the known methods, e.g. by passing a flow of propellant along the processing liquid as used in carburetors of combustion engines. Nozzle 4 may comprise a mixing chamber (now shown) wherein the propellant and the processing liquid are mixed.

The jetted or sprayed liquid forms a body which may have any shape, that is referred to hereafter as a "cone", regardless of the specific form of said body. The treatment zone of each nozzle 4 has an area which depends on the diverging angle of the jet or spray cone 14, the above mentioned distance between nozzle(s) 4 and surface 13 and the angle between the axis of cone 14 and surface 13. It should be stressed that the specific values of these angles and said distance depend on many parameters such as the nature of the coating to be removed from surface 13, the composition of the processing liquid, and the composition and morphology of surface 13. Without limiting the scope of the invention thereto, typical values of the diverging angle of cone 14 may be between 5° and 50°, the distance between nozzle 4 and opening 3 is preferably between 60 and 100 mm, and the angle between the center axis of cone 14 and surface 13 may typically be between 45° and 90°. The latter angle is determined by the angle between the center axis of housing 1 and surface 13 as well as by the angle between the center axis of nozzle 4 and the center axis of housing 1. In a preferred embodiment, both the latter angles are about 90° as shown in FIG. 2. In a preferred embodiment, said diverging angle of cone 14, said distance between nozzle 4 and opening 3 and said angle between the center axis of nozzle 4 and the center axis of housing 1 is adjustable by the operator or by the manufacturer of the apparatus.

The distance between nozzle 4 and surface 13 is the sum of the distance between nozzle 4 and opening 3 on the one hand and the gap which is left during operation of the apparatus between opening 3 and surface 13 on the other hand. Preferably, said gap is essentially zero, i.e. during operation of the apparatus the edge 2 preferably touches surface 13 or is put very close to surface 13. Otherwise, a substantial gap may be left between the apparatus and surface 13, e.g. a few millimeters wide, so that air may flow from outside the apparatus into the suction chamber 9, thereby forming a barrier against liquid leaving the apparatus. If a gap is left between edge 2 and surface 13, then the rubbing means 8 should protrude beyond edge 2 so as to maintain mechanical contact between rubbing means 8 and surface 13.

In the embodiment wherein the apparatus comprises a single jet or spray nozzle 4, that nozzle is preferably positioned near the center axis of the housing 1. In another embodiment comprising a plurality of nozzles 4, these nozzles 4 may be positioned around the center axis of housing 1 and the axis of each nozzle 4 may be inclined versus the axis of housing 1 so that the treatment areas of all nozzles 4 overlap or are identical. According to still another embodiment, the treatment areas of each nozzle 4 do not overlap or overlap only to a minor extent so that the combined treatment area of all nozzles 4 is substantially larger that the treatment area of a single nozzle 4.

The jet or spray cone 14 of nozzle 4 intersects opening 3 to form portion 5 of said opening 3. Said portion 5 has a perimeter 6 that may have any form, but preferably is oblong, oval or circular (the latter is shown in FIG. 3). The treatment area has essentially the same shape as portion 5. The treatment area coincides with portion 5 when no gap is left between the apparatus and surface 13. In the embodiment wherein the treatment area has not a circular shape, nozzle 4 may be rotatably mounted in housing 1 so that a circular treatment area is produced by a single revolution along the center axis of nozzle 4.

The section of opening 3 which does not coincide with portion 5 forms a suction orifice that is coupled to a suction chamber 9, which is surrounded by housing 1. Said suction orifice preferably surrounds portion 5. Suction chamber 9 is coupled to an evacuation channel 11 which is coupled to means for maintaining a sub-pressure in suction chamber 9 at a level which produces the necessary suction force to evacuate effectively the processing liquid backwards from the suction orifice. Such means are generally known to the skilled person and may comprise a vacuum source such as a pump, hoses, filters, etc.

The rubbing means 8 form a barrier between the jet or spray cone 14 and the suction chamber 9. More particularly, the rubbing means 8 extend from within the apparatus towards opening 3 and are positioned along perimeter 6 of the portion 5 of opening 3, wherein processing liquid is jetted or sprayed; the rubbing means thereby form a boundary between said portion 5 of opening 3 on the one hand and the suction chamber 9 on the other hand. The wording "along perimeter 6" shall be understood as meaning that the rubbing means 8 are positioned on or nearby perimeter 6. The rubbing means 8 may form a complete boundary or an incomplete boundary, i.e. the rubbing means 8 may be provided along the whole perimeter 6 or along a section or sections of perimeter 6 (3 sections shown in FIG. 3). The term "boundary" shall not be understood as a closed physical barrier for the processing liquid and substances from the coating of the imaging material contained therein, since the advantageous effect of the present invention is produced by the effect that, upon operation of the apparatus, the jetted or sprayed processing liquid, which hits surface 13, passes through or between rubbing means 8 before being drawn into suction chamber 9 and evacuated. The rubbing means 8 can be e.g. composed of a fabric or cloth, which is permeable for the processing liquid, or of small rubbing bodies consisting of, covered with or coated with a material that is capable of effecting friction on surface 13, e.g. rubber, cotton, or plastic. In a preferred embodiment, rubbing means 8 comprise brush hairs between which the processing liquid can pass and enter into the suction chamber 9. An incomplete boundary, wherein the rubbing means 8 along perimeter 6 are spaced apart, may be advantageous for a better evacuation of processing liquid.

The rubbing means 8 are rotatably mounted in the apparatus, e.g. on a shaft 12, so that the rubbing means 8 are capable of rotating, thereby exerting a friction on surface 13. The rotational movement of the rubbing means 8 can be driven by the known means, such as a motor. In a preferred embodiment, the rotation is driven by the pressure of the media that are supplied to nozzle 4, such as the processing liquid or propellant, e.g. by providing shaft 12 with one or more fins or other known means such as those used in drills driven by pressurized air.

The supply channel and the evacuation channel are preferably connected to a supply pipe and an evacuation pipe respectively, which may consist of a hose. The supply pipe for fresh processing liquid preferably extends inside the evacuation pipe for spent liquid. The supply pipe and/or the evacuation pipe may be connected to a service unit which preferably includes a tank for fresh processing liquid, equipment for treating the used liquid containing substances from the coating of the imaging material, a vacuum pump connected to the evacuation pipe, an optional high-pressure pump connected to the supply pipe, filters, and the necessary electronics and mechanics for driving the service unit.

The apparatus preferably processes the imaging material scanwise. When used for processing a material mounted on a drum or a print cylinder of a printing press, the apparatus is preferably guided along a line parallel to the axis of the cylinder while the cylinder itself rotates and the edge of the apparatus is held at a constant distance close to the imaging material. The center axis of the housing 1 is preferably held perpendicular to the imaging material, although other configurations are also possible. During the processing operation, the axial translation of the apparatus and the revolution speed of the cylinder are preferably driven by a control unit which may also be coupled to the service unit that controls the rate of feed to the nozzle head and the rate of evacuation from the suction chamber. Both supply and evacuation pressures are preferably adjusted so as to obtain efficient processing without any liquid penetrating out the apparatus through the gap, and preferably also to obtain an essentially dry surface immediately after the passage of the apparatus.

EXAMPLES

As a comparative example, two commercially available lithographic plate materials, which require alkaline processing, were image-wise exposed and developed in a conventional processor Thermostar™ P970, a positive working thermal material from Agfa-Gevaert, was exposed in a Creo Trendsetter™ 3244T at 140 rpm with a power setting of 5.4 Watt and developed with EP26 in an Autolith™ processor, both available from Agfa-Gevaert.

N61, a negative working UV-sensitive "PS" plate from Agfa-Gevaert, was exposed in a CDL1502i UV contact imager at intensity 600E level 3, and developed with EN232 developer in an Autolith processor (all materials from Agfa-Gevaert).

Both these materials were also processed according to the invention by mounting the exposed materials on a drum and then applying the same developer as used in the comparative examples by means of an apparatus as shown in FIG. 1, equipped with a commercially available nozzle specified below. The apparatus was translated in the axial direction of the drum, rotating at a speed of 100 m/min, while keeping it at a constant distance from the plate material. Meanwhile, the suction nozzle was also engaged, thereby collecting the developer and substances from the coating of the materials dissolved therein. The processing liquid was applied according to two different methods using the following parameters:

"Low Pressure":

nozzle Quickjet QVVA, supplied by Spraying Systems, Brussels, Belgium;

axial translation of the nozzle of 1.1 m/min;

flow rate of processing liquid of 15 ml/min, applied at a pressure slightly above normal atmospheric pressure ("spray mode");

distance between nozzle and plate surface of 30 mm;

the plate was rinsed with water supplied by another nozzle of the type Quickjet QUA that traveled 40 seconds behind the QVVA nozzle. The QUA nozzle acts as a high-pressure washer operating at 60 bar and consuming 5 liter/m$^2$ of water. "High Pressure":

nozzle Quickjet QUA, supplied by Spraying Systems, Brussels, Belgium;

axial translation of the nozzle of 0.8 m/min;

flow rate of processing liquid of 4 ml/min, applied at a pressure of 30 bar ("jet mode");

distance between nozzle and plate surface of 5 mm;

after development, the same QUA nozzle was used in a second pass to rinse the surface with water applied at 30 bar and at a flow rate of 5 liter/m$^2$.

Finally, the plates were dried using pressurized air at room temperature. The six plates (two materials×three processing methods) thus obtained were separately mounted on a Heidelberg GTO46 printing press and for each plate a press run of 5000 copies was started using K+E 800 Skinnex ink and Combifix 4% from Hostman Steinberg with 10% isopropanol in water as fountain.

The print quality of the plates was evaluated by measuring the dot gain of 10%, 40% and 70% screen planes. Also toning (ink acceptance in non-image areas) was evaluated and a general visual inspection of the quality of the printed copies was made. The processing methods according to the invention produced plates with a quality that was very comparable with the conventionally processed plates.

We claim:

1. A method of making a lithographic image by providing an imaging material comprising a support and a heat- or light-sensitive coating;

image-wise exposure of the coating to heat or light, thereby obtaining a latent image in said coating, the latent image consisting of a set of exposed areas in the coating and a set of non-exposed areas in the coating;

development of the latent image by supplying a processing liquid to the coating and evacuating, by means of a suction device, the processing liquid together with
   (i) substances removed from the exposed areas without removing such substances from the non-exposed areas or
   (ii) substances removed from the non-exposed areas without removing such substances from the exposed areas.

2. A method according claim 1 wherein the suction device is a porous material that is capable of absorbing the processing liquid.

3. A method according claim 1 wherein the development step is carried out by means of an apparatus comprising an elongated housing having at an end thereof an edge which surrounds an opening;

a jet or spray nozzle, which is disposed in the housing and spaced from the opening, for jetting or spraying the processing liquid on the imaging material;

a supply channel connected to the jet or spray nozzle for supplying the processing liquid to the jet or spray nozzle;

a suction chamber surrounding the jet or spray nozzle;

an evacuation channel connected to the suction chamber for maintaining a sub-pressure in the suction chamber in order to remove the processing liquid from the imaging material.

4. A method according to claim 1 wherein the development step is carried out by means of an apparatus comprising an elongated housing having at an end thereof an edge which surrounds an opening;

a jet or spray nozzle, which is disposed in the housing and spaced from the opening, for jetting or spraying the processing liquid on the imaging material through a portion of the opening, said portion having a perimeter;

a supply channel connected to the jet or spray nozzle for supplying the processing liquid to the jet or spray nozzle;

rubbing means for mechanically treating the layer(s), which are rotatably mounted and which extend from within the housing towards the opening and are disposed along said perimeter; said rubbing means and said housing defining a suction chamber;

an evacuation channel connected to the suction chamber for maintaining a sub-pressure in the suction chamber in order to remove the processing liquid drawn from between the rubbing means.

5. A method according to claim 1 wherein the coating is not substantially ablated during the image-wise exposure.

6. A method according to claim 1 wherein the processing liquid is an aqueous alkaline liquid.

7. A method according to claim 1 further comprising a rinsing step in which water or an aqueous liquid is supplied to the image.

8. A method according to claim 1 wherein the steps of exposure and development are carried out while the lithographic printing plate precursor is mounted in a plate-setter or a printing press.

9. A method according to claim 1 wherein the support has a hydrophilic surface or is provided with a hydrophilic layer and wherein the coating is hydrophobic or is rendered hydrophobic by the exposure.

* * * * *